United States Patent
Leen et al.

(10) Patent No.: US 10,412,849 B2
(45) Date of Patent: Sep. 10, 2019

(54) HARDWARE MIGRATION

(71) Applicant: Honeywell International Inc., Morris Plains, NJ (US)

(72) Inventors: Cary Leen, Hammond, WI (US); Andrew David Halford, Manchester, MD (US); Roy Alan Kolasa, Kansas City, MO (US); Derek Tai, Hong Kong (CN); Jayaprakash Meruva, Bangalore (IN)

(73) Assignee: Honeywell International Inc., Morris Plains, NJ (US)

( * ) Notice: Subject to any disclaimer, the term of this patent is extended or adjusted under 35 U.S.C. 154(b) by 201 days.

(21) Appl. No.: 15/190,002

(22) Filed: Jun. 22, 2016

(65) Prior Publication Data
US 2017/0374756 A1     Dec. 28, 2017

(51) Int. Cl.
*H05K 7/14*     (2006.01)
*H01R 12/52*    (2011.01)
*H02G 3/08*     (2006.01)

(52) U.S. Cl.
CPC .......... *H05K 7/1468* (2013.01); *H01R 12/52* (2013.01); *H02G 3/08* (2013.01); *H05K 7/1427* (2013.01); *H05K 7/1467* (2013.01)

(58) Field of Classification Search
CPC ..... H05K 7/1468; H05K 7/1427; H01R 12/52
USPC .... 361/679.4, 686, 727, 731, 728–730, 752, 361/790
See application file for complete search history.

(56) References Cited

U.S. PATENT DOCUMENTS

| | | | | |
|---|---|---|---|---|
| 5,428,535 A | * | 6/1995 | Katsumata | ........... B60R 16/0238 361/641 |
| 5,436,794 A | * | 7/1995 | Clemente | ............. H05K 7/1467 174/51 |
| 5,808,861 A | * | 9/1998 | Nakajima | ............ B60G 17/052 361/679.27 |
| 7,230,833 B1 | * | 6/2007 | Sickels | ............... B60R 16/0239 361/740 |

(Continued)

FOREIGN PATENT DOCUMENTS

| | | |
|---|---|---|
| EP | 0661915 A1 | 7/1995 |
| WO | 2015063292 A1 | 5/2015 |

OTHER PUBLICATIONS

Tracer Summit TM, "Building Automation System", https://www.trane.com/content/dam/Trane/Commercial/global/controls/equipment-controls/BAS/Legacy/TraderSummit/documents/BAS-PRC001-EN_11012009.pdf, Nov. 2009, (20 pgs.).

(Continued)

*Primary Examiner* — Steven T Sawyer
*Assistant Examiner* — Sagar Shrestha
(74) *Attorney, Agent, or Firm* — Seager, Tufte & Wickhem LLP (57) ABSTRACT

Methods, devices, and systems for hardware migration are described herein. One device includes a top housing, a plurality of input/output (I/O) adapter boards housed by the top housing, a base housing adjacent to the top housing, and a printed circuit board (PCB) base adjacent to the plurality of I/O adapter boards and housed by the base housing, wherein the plurality of I/O adapter boards are electrically connected to the PCB base, and the PCB base includes a plurality of traces configured to provide an electrical path for inputs from a wiring baseboard of an existing controller to the plurality of I/O adapter boards.

13 Claims, 4 Drawing Sheets

(56) References Cited

U.S. PATENT DOCUMENTS

| | | | |
|---|---|---|---|
| 2002/0170732 A1* | 11/2002 | Chiriku | H01H 50/12 |
| | | | 174/59 |
| 2012/0106058 A1* | 5/2012 | Chin | H05K 7/1467 |
| | | | 361/679.4 |
| 2013/0231793 A1 | 9/2013 | Elliot et al. | |
| 2015/0106447 A1 | 4/2015 | Hague | |
| 2016/0174406 A1* | 6/2016 | Dobler | H05K 7/1461 |
| | | | 361/752 |
| 2016/0286674 A1 | 9/2016 | Bury et al. | |
| 2018/0092235 A1* | 3/2018 | Mielnik | H05K 7/1474 |

OTHER PUBLICATIONS

Extended Search and Written Opinion from related EP Patent Application 17169810, dated Jan. 26, 2018, 7 pages.

\* cited by examiner

HARDWARE MIGRATION

TECHNICAL FIELD

The present disclosure relates to methods, devices, and systems for hardware migration.

BACKGROUND

Building controllers can provide centralized control of distributed systems in a building by a building automation system. For example, building controllers can allow for centralized control of a heating, ventilation, and air-conditioning (HVAC) system of a building by a building automation system.

Building controllers can utilize different inputs to determine information about devices included in a building automation system. For example, a building controller can utilize inputs such as temperature, pressure, and/or humidity, among other inputs, to determine information about equipment in a building's HVAC system, such as the status of a boiler.

Building controllers can output various signals to devices included in a building automation system. For example, a building controller can output a signal to a boiler to increase a supply water temperature output from the boiler.

The inputs and outputs of a building controller can include different types of signals. For example, the types of signals may include an analog input/output signal, a binary input/output signal, and/or a digital input/output signal.

DETAILED DESCRIPTION

Methods, devices, and systems for hardware migration are described herein. For example, one or more embodiments include a top housing, a plurality of input/output (I/O) adapter boards housed by the top housing, a base housing adjacent to the top housing, and a printed circuit board (PCB) base adjacent to the plurality of I/O adapter boards and housed by the base housing, wherein the plurality of I/O adapter boards are electrically connected to the PCB base, and the PCB base includes a plurality of traces configured to provide an electrical path for inputs from a wiring baseboard of an existing controller to the plurality of I/O adapter boards.

Building controllers can allow for efficient operation of building systems. Further, building controllers can reduce energy consumption and operating costs of various building systems.

Efficient operation of building systems can depend on the building controllers in use. For example, older building controllers may not work as well as newer, more efficient building controllers. However, incorporation of newer building controllers into existing building systems may be difficult, since newer controllers may not be wired correctly for use in older building automation systems.

Previous approaches for replacing older and/or less efficient building controllers can be arduous and lengthy. For example, in such previous approaches, wiring panels may need to be removed and connections rewired for use with a newer building controller. Rewiring panels can result in high labor costs as well as significant downtime to a consumer, such as a building owner or operator, during a changeover from older to newer building controllers.

Embodiments of the present disclosure can allow for replacement of older and/or less efficient building controllers without the need to remove and/or rewire connections of a wiring panel. By avoiding the need to remove and/or rewire the wiring panel, older and/or less efficient building controllers can be replaced more quickly, reducing consumer downtime and cost.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2.

As used herein, "a" or "a number of" something can refer to one or more such things. For example, "a number of terminals" can refer to one or more terminals.

Figure 1:
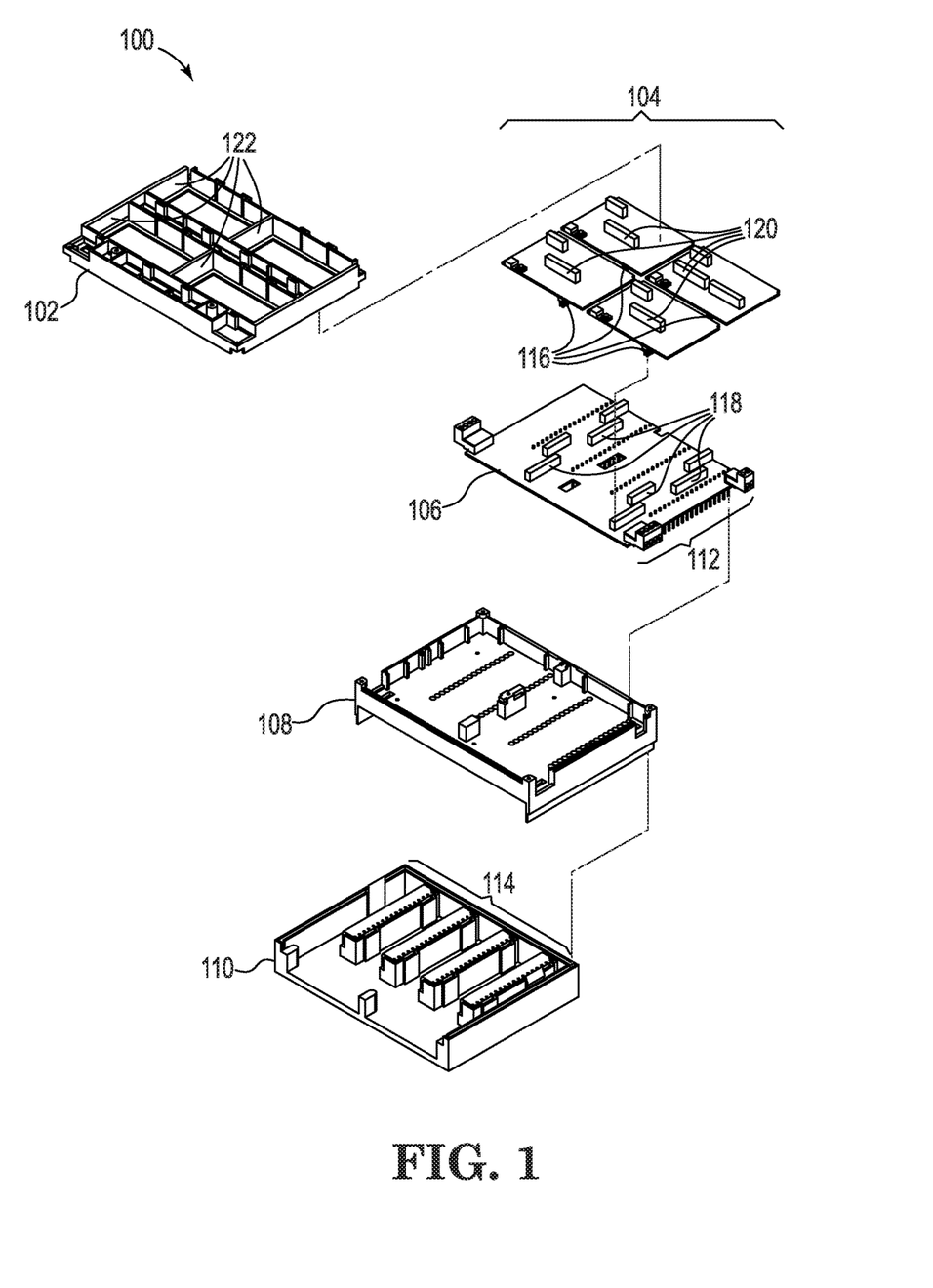
FIG. 1 is an exploded perspective view of a hardware migration device, in accordance with one or more embodiments of the present disclosure.

FIG. 1 is an exploded perspective view of a hardware migration device 100, in accordance with one or more embodiments of the present disclosure. As shown in FIG. 1, the hardware migration device 100 can include a top housing 102, a plurality of input/output (I/O) adapter boards 104, a printed circuit board (PCB) base 106, and a base housing 108. Also shown in FIG. 1 is a wiring baseboard 110 of an existing (e.g., previously installed) building controller of a building system.

The plurality of I/O adapter boards 104 can be housed by the top housing 102. The top housing 102 can include a plurality of slots 122 that can house the plurality of I/O adapter boards 104. For example, the top housing 102 can include four slots 122 in which four I/O adapter boards may be physically connected to the top housing 102.

Although the plurality of I/O adapter boards 104 are shown in FIG. 1 as including four I/O adapter boards, embodiments of the present disclosure are not so limited.

For example, the plurality of I/O adapter boards 104 can include less than four (e.g., three, two, or one I/O adapter board(s)).

The plurality of I/O adapter boards 104 can be printed circuit boards. As used herein, a printed circuit board (e.g., PCB) refers to a board that mechanically supports and electrically connects electrical components using conductive tracks (e.g., traces), pads, and/or other methods of electrical connection. The traces can, for example, be etched from sheets of material laminated onto a substrate.

Hardware migration device 100 can include a base housing 108. The base housing 108 can be adjacent to the top housing 102. For example, the base housing 108 can be physically connected to the top housing 102 such that the top housing 102 and the base housing 108 are adjacent to each other.

Hardware migration device 100 can include PCB base 106 adjacent to the plurality of I/O adapter boards 104. The PCB base 106 can be housed by the base housing 108. For example, the PCB base 106 may be physically connected to the base housing 108 such that the PCB base 106 is adjacent to the plurality of I/O adapter boards 104. The PCB base 106 can be a printed circuit board.

The plurality of I/O adapter boards 104 can be electrically connected to the PCB base 106. For example, the plurality of I/O adapter boards 104 can be electrically connected to the PCB base 106 such that an electric current can flow between the plurality of I/O adapter boards 104 and the PCB Base 106.

Each of the plurality of I/O adapter boards 104 can include a number of receiving terminals 120. For example, the number of receiving terminals 120 can be female pin headers to receive connection pins of a new controller and/or a number of new I/O modules, as will be further described with respect to FIGS. 2-4.

Each of the plurality of I/O adapter boards 104 can include a number of connection pins 116. For example, the number of connection pins 116 can be male pin headers.

The PCB base 106 can include a number of receiving terminals 118 and a number of connection pins 112. In some examples, the number of receiving terminals 118 can be female pin headers. The number of receiving terminals 118 of the PCB base 106 can receive the number of connection pins 116 of the plurality of I/O adapter boards 104 to provide an electrical connection between the PCB base 106 and the plurality of I/O adapter boards 104.

Although the plurality of I/O adapter boards 104 and the PCB base 106 are shown in FIG. 1 as having the number of connection pins 116 and the number of receiving terminals 118, respectively, embodiments of the present disclosure are not so limited. In some examples, the plurality of I/O adapter boards can include a number of receiving terminals, and the PCB base can include a number of connection pins, where the number of receiving terminals of each of the plurality of I/O adapter boards can receive the number of connection pins of the PCB base to provide an electrical connection between the PCB base and the plurality of I/O adapter boards.

The number of receiving terminals 118 of the PCB base 106 can be connected to a plurality of traces of PCB base 106. As used herein, a trace can include an electrical path on a circuit board. The plurality of traces of the PCB base 106 can connect the number of connection pins 112 to the number of receiving terminals 118 to provide an electrical path between the number of receiving terminals 118 and the number of connection pins 112.

The number of connection pins 112 of the PCB base 106 can connect to receiving terminals 114 of the wiring baseboard 110 to provide an electrical connection between the receiving terminals 114 of the wiring baseboard 110 and the PCB base 106. For example, the PCB base 106 can be electrically connected to the receiving terminals 114 of the wiring baseboard 110 such that an electric current can flow between the receiving terminals 114 of the wiring baseboard 110 and the PCB base 106.

The plurality of traces of the PCB base 106 can provide an electrical path for inputs from the receiving terminals 114 of the wiring baseboard 110 of an existing controller (e.g., a building controller) to the plurality of I/O adapter boards 104, as will be further described in connection with FIGS. 2-4.

Hardware migration device 100 can allow for the replacement of existing I/O modules and/or controllers with newer technology, such as new and/or updated I/O modules and/or controllers. For example, hardware migration device 100 can connect to the wiring baseboard 110 to allow for the replacement of existing I/O modules and/or controllers with new I/O modules and/or controllers, by providing updated electrical connections via PCBs (e.g., the plurality of I/O adapter boards and the PCB base).

Providing the electrical connections needed to update existing I/O modules and/or controllers via the plurality of I/O adapter boards and the PCB base can eliminate the need to remove and rewire connections of a wiring panel, such as the wiring baseboard 110 shown in FIG. 1. By not having to remove and rewire connections, high labor costs and significant downtime during a changeover from older to newer I/O modules and/or controllers can be avoided.

Additionally, housing the plurality of I/O adapter boards in the top housing and the PCB base in the base housing allows for installation of upgraded equipment while maintaining the original footprint of the existing I/O modules and/or controllers being replaced, preventing the need to find additional space in the wiring panel. Further, no permanent modification of the existing wiring panel is required, allowing for the option to revert to older I/O modules and/or controllers should the need arise.

Figure 2:
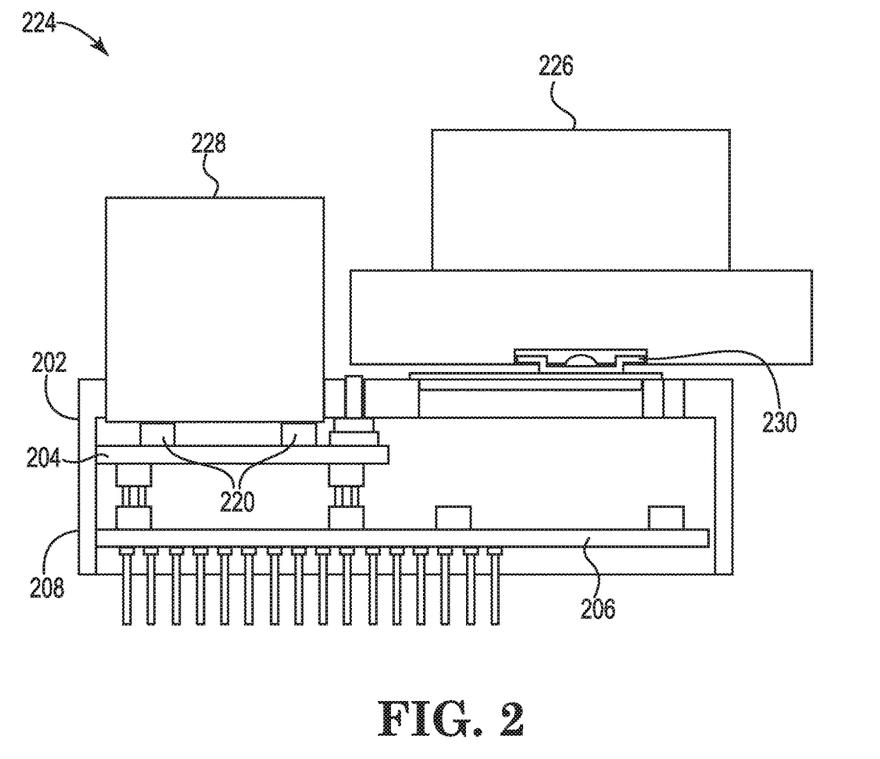
FIG. 2 is an example of a hardware migration device, in accordance with one or more embodiments of the present disclosure.

FIG. 2 is an example of a hardware migration device 224, in accordance with one or more embodiments of the present disclosure. As shown in FIG. 2, the hardware migration device 224 can include a top housing 202 (e.g., top housing 102, previously described in connection with FIG. 1), a plurality of I/O adapter boards 204 (e.g., plurality of I/O adapter boards 104, previously described in connection with FIG. 1), a PCB base 206 (e.g., PCB base 106, previously described in connection with FIG. 1), and a base housing 208 (e.g., base housing 108, previously described in connection with FIG. 1).

As shown in FIG. 2, each of the plurality of I/O adapter boards 204 can include a number of receiving terminals 220 (e.g., number of receiving terminals 120, previously described in connection with FIG. 1). The number of receiving terminals 220 can connect to connection pins (e.g., not shown in FIG. 2 for clarity and so as not to obscure embodiments of the present disclosure) of a number of new I/O modules 228 of a new controller 226 to provide an electrical connection between the plurality of I/O adapter boards 204 and the number of new I/O modules 228. For example, the number of new I/O modules 228 can be electrically connected to the plurality of I/O adapter boards 204 such that an electric current can flow between the number of new I/O modules 228 and the plurality of I/O adapter boards 204 via the number of receiving terminals 220 and the number of connection pins of the number of new I/O modules 228.

Although not shown in FIG. 2 for clarity and so as not to obscure embodiments of the present disclosure, each of the plurality of I/O adapter boards 204 can include a number of receiving terminals to connect to a new controller 226 to provide an electrical connection between the plurality of I/O adapter boards 204 and the new controller 226. For example, the new controller 226 can be electrically connected to the plurality of I/O adapter boards 204 by the number of receiving terminals of the plurality of I/O adapter boards 204 receiving a number of connection pins of the new controller 226 such that an electric current can flow between the new controller 226 and the plurality of I/O adapter boards 204.

A controller can include hardware and/or software for use in receiving signals from various devices included in a building automation system, as well as outputting various signals to the devices included in the building automation system. For instance, a controller can receive and/or transmit signals to devices included in the building automation system. For example, a controller can be used for monitoring and/or controlling devices included in electrical, plumbing, and/or HVAC systems of a building automation system, among other applications.

The new controller 226 can be physically connected to the top housing 202 by a Deutches Institut für Normung (DIN) rail 230. For example, DIN rail 230 can be a metal rail of a standard type to physically connect the new controller 226 to the top housing 202. The DIN rail 230 can secure the new controller 226 to the top housing 202 to prevent movement of the new controller 226, as well as to preserve the original footprint (e.g., the original physical dimensions) of the existing controller being replaced so as to preserve space in a wiring panel.

Figure 3:
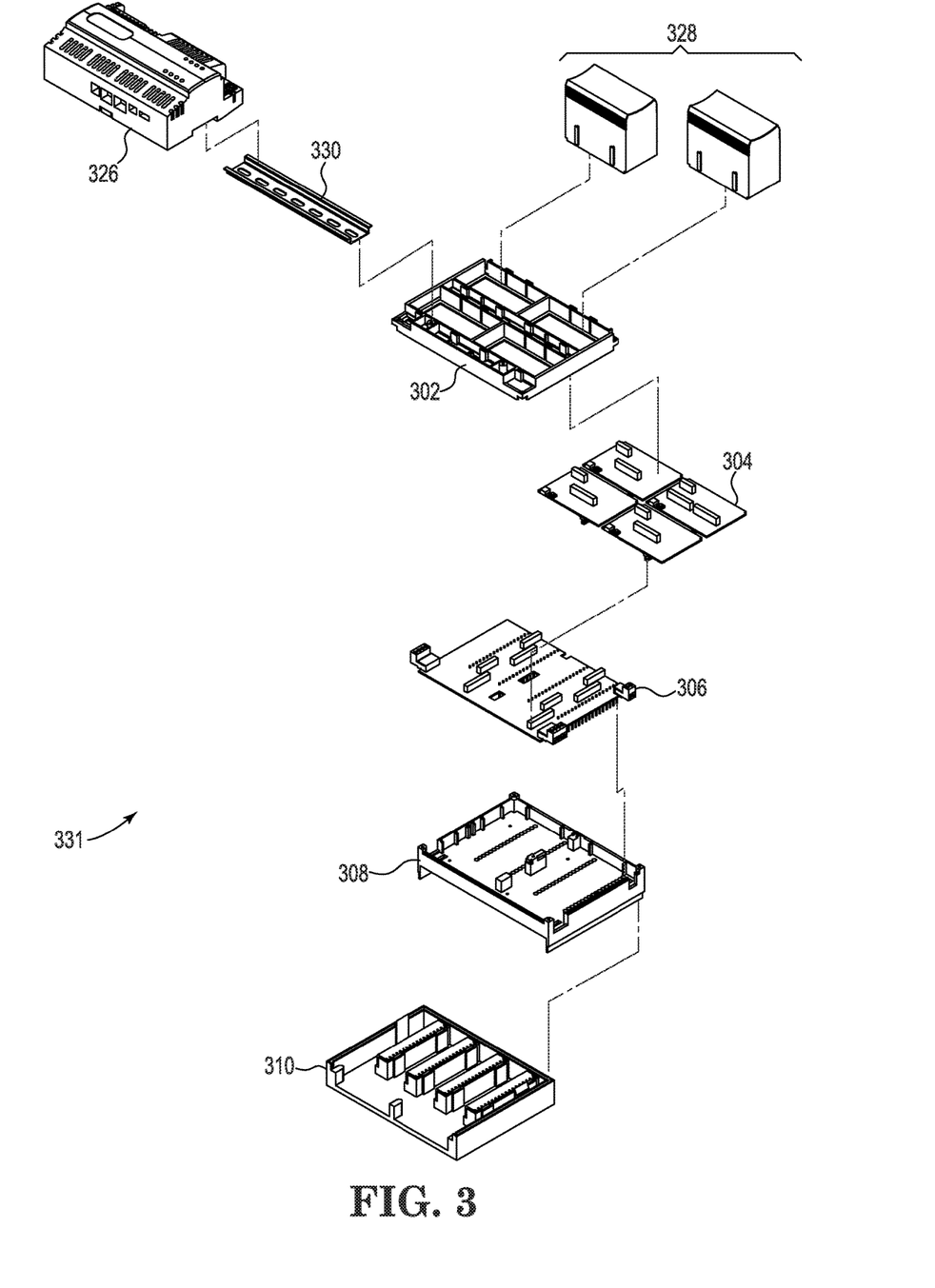
FIG. 3 is an exploded view of a system for hardware migration, in accordance with one or more embodiments of the present disclosure.

FIG. 3 is an exploded view of a system 331 for hardware migration, in accordance with one or more embodiments of the present disclosure. As shown in FIG. 3, the system 331 can include a new controller 326 (e.g., new controller 226, previously described in connection with FIG. 2), having a number of new I/O modules 328 (e.g., number of new I/O modules 228, previously described in connection with FIG. 2), a top housing 302 (e.g., top housing 102 and 202, previously described in connection with FIGS. 1 and 2, respectively), a plurality of I/O adapter boards 304 (e.g., plurality of I/O adapter boards 104 and 204, previously described in connection with FIGS. 1 and 2, respectively), a PCB base 306 (e.g., PCB base 106 and 206, previously described in connection with FIGS. 1 and 2, respectively), and a base housing 308 (e.g., base housing 108 and 208, previously described in connection with FIGS. 1 and 2, respectively).

The top housing 302 housing the plurality of I/O adapter boards 304 and the base housing 308 housing the PCB base 306 can be used to migrate (e.g., upgrade, update, and/or replace) existing I/O modules and/or controllers connected to the wiring baseboard 310. For example, although not shown in FIG. 3 for clarity and so as not to obscure embodiments of the present disclosure, an existing controller and/or a number of existing I/O modules can be removed from the wiring baseboard 310. The wiring baseboard 310 can be left intact (e.g., the wiring baseboard 310 is not removed and/or rewired).

An existing controller and/or an existing number of I/O modules can be replaced using a new controller 326 and/or a number of new I/O modules 328 by using a hardware migration device (e.g., hardware migration device 100, 224, previously described in connection with FIGS. 1 and 2, respectively). The hardware migration device can include the plurality of I/O adapter boards 304 that are housed by the top housing 302, and the PCB base 306 housed by the base housing 308, where the PCB base 306 is adjacent to and electrically connected to the plurality of I/O adapter boards 304. Additionally, the PCB base 306 is adjacent to and electrically connected to the wiring baseboard 310.

The plurality of I/O adapter boards 304 can be electrically connected to the PCB base 306 (e.g., as previously described in connection with FIG. 1). For example, the plurality of I/O adapter boards 304 can be electrically connected to the PCB base 306 such that an electric current can flow between the plurality of I/O adapter boards 304 and the PCB base 306.

The PCB base 306 can include a plurality of traces to provide an electrical path for inputs from the wiring baseboard 310 to the plurality of I/O adapter boards 304 (e.g., as previously described in connection with FIG. 1). For example, the plurality of I/O adapter boards 304 can be electrically connected to the wiring baseboard 310 via the plurality of traces of the PCB base 306 such that an electric current can flow between the plurality of I/O adapter boards 304 and the wiring baseboard 310.

Replacing an existing controller with a new controller 326 can include electrically connecting the new controller 326 to two of the plurality of I/O adapter boards 304, where the new controller 326 is adjacent to the two of the plurality of I/O adapter boards 304. For example, a new controller 326 can be electrically connected to two of the plurality of I/O adapter boards 304 by a number of receiving terminals (e.g., number of receiving terminals 120, 220, previously described in connection with FIGS. 1 and 2, respectively) of two of the plurality of I/O adapter boards 304 receiving a number of connection pins of the new controller 326 (e.g., as previously described in connection with FIG. 2).

Electrically connecting the new controller 326 to two of the plurality of I/O adapter boards 304 can allow for the new controller 326 to be electrically connected to the wiring baseboard 310 via the two of the plurality of I/O adapter boards 304 and the PCB base 306. For example, the new controller 326 can be electrically connected to the wiring baseboard 310 such that an electric current can flow between the new controller 326 and the wiring baseboard 310.

The new controller 326 can be physically connected to the top housing 302 by a DIN rail 330 (e.g., DIN rail 230, previously described in connection with FIG. 2).

Replacing an existing number of I/O modules with a number of new I/O modules 328 can include electrically connecting the number of new I/O modules 328 to two of the plurality of I/O adapter boards 304 where the number of new I/O modules 328 are adjacent to the two of the plurality of I/O adapter boards 304. For example, a number of new I/O modules 328 can be electrically connected to two of the plurality of I/O adapter boards 304 by a number of receiving terminals (e.g., number of receiving terminals 120, 220, previously described in connection with FIGS. 1 and 2) of two of the plurality of I/O adapter boards 304 receiving a number of connection pins of the number of new I/O modules 328 (e.g., as previously described in connection with FIG. 2).

Electrically connecting the number of new I/O modules 328 to two of the plurality of I/O adapter boards 304 can allow for the number of new I/O modules 328 to be electrically connected to the wiring baseboard 310 via the two of the plurality of I/O adapter boards 304 and the PCB base 306. For example, the number of new I/O modules 328 can be electrically connected to the wiring baseboard 310 such that an electric current can flow between the number of new I/O modules 328 and the wiring baseboard 310.

Although the hardware migration device is shown in FIG. 3 as including two new I/O modules 328, embodiments of the present disclosure are not so limited. For example, less than two (e.g., one or zero) new I/O modules 328 can be included in the hardware migration device.

Figure 4:
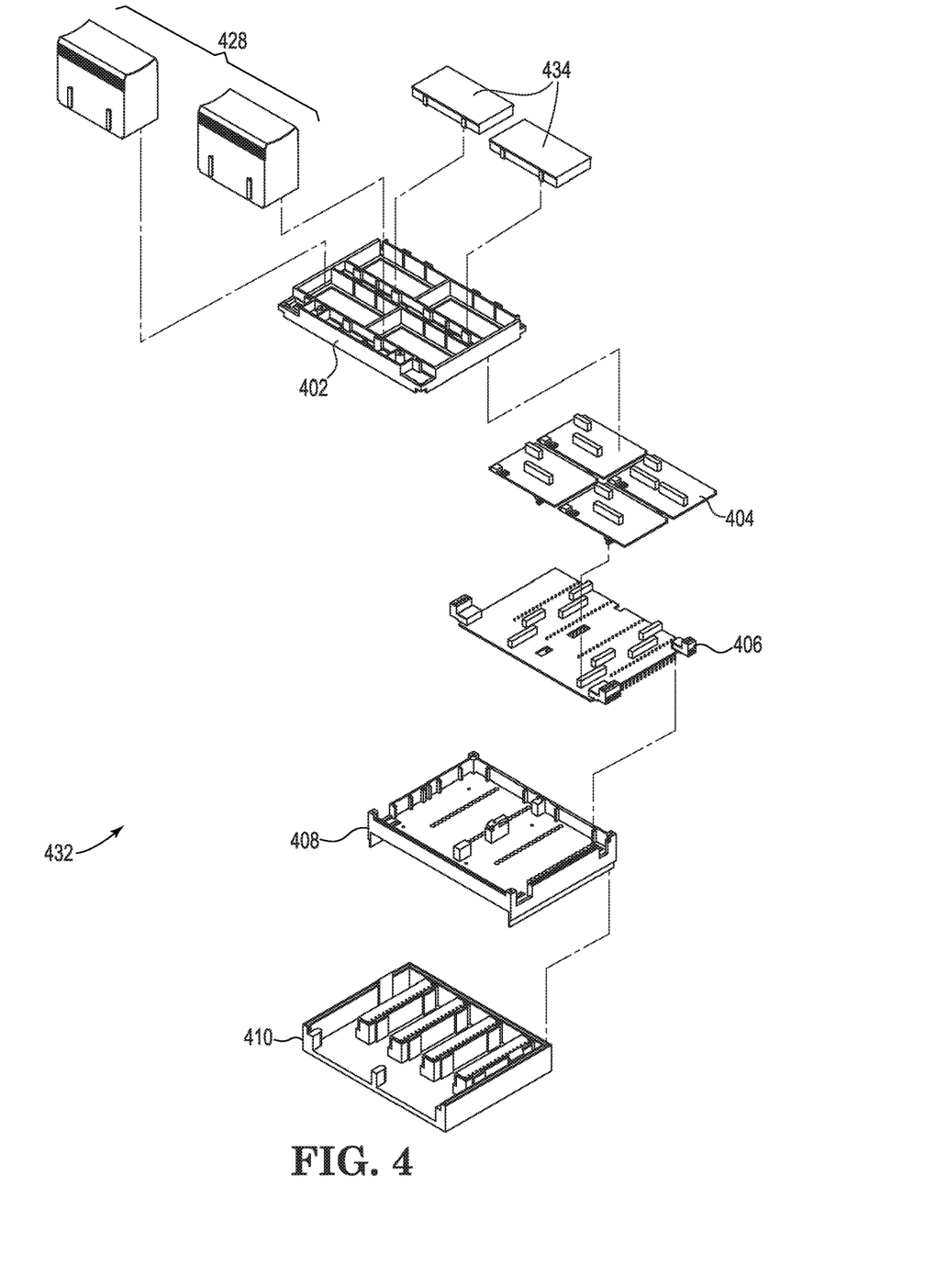
FIG. 4 is an exploded view of a system for hardware migration, in accordance with one or more embodiments of the present disclosure.

FIG. 4 is an exploded view of a system 432 for hardware migration, in accordance with one or more embodiments of the present disclosure. As shown in FIG. 4, the system 432 can include a number of new I/O modules 428 (e.g., number of new I/O modules 228 and 328, previously described in connection with FIGS. 2 and 3, respectively), a top housing 402 (e.g., top housing 102, 202, and 302, previously described in connection with FIGS. 1, 2, and 3, respectively), a plurality of I/O adapter boards 404 (e.g., plurality of I/O adapter boards 104, 204, and 304, previously described in connection with FIGS. 1, 2, and 3, respectively), a PCB base 406 (e.g., PCB base 106, 206, and 306, previously described in connection with FIGS. 1, 2, and 3, respectively), and a base housing 408 (e.g., base housing 108, 208, and 308, previously described in connection with FIGS. 1, 2, and 3, respectively).

Similar to the embodiment described in FIG. 3, the top housing 402 housing the plurality of I/O adapter boards 404 and the base housing 408 housing the PCB base 406 can be used to migrate (e.g., upgrade, update, and/or replace) existing I/O modules connected to the wiring baseboard 410. For example, although not shown in FIG. 4 for clarity and so as not to obscure embodiments of the present disclosure, a number of existing I/O modules can be removed from the wiring baseboard 410. The wiring baseboard 410 can be left intact (e.g., the wiring baseboard 410 is not removed and/or rewired).

The existing number of I/O modules can be replaced with a number of new I/O modules 428 by using a hardware migration device (e.g., hardware migration device 100, 224, previously described in connection with FIGS. 1 and 2, respectively). The hardware migration device can include the plurality of I/O adapter boards 404 that are housed by the top housing 402, and the PCB base 406 housed by the base housing 408, where the PCB base 406 is adjacent to and electrically connected to the plurality of I/O adapter boards 404. Additionally, the PCB base 406 is adjacent to and electrically connected to the wiring baseboard 410.

The plurality of I/O adapter boards 404 can be electrically connected to the PCB base 406 (e.g., as previously described in connection with FIG. 1). For example, the plurality of I/O adapter boards 404 can be electrically connected to the PCB base 406 such that an electric current can flow between the plurality of I/O adapter boards 404 and the PCB Base 406.

The PCB base 406 can include a plurality of traces to provide an electrical path for inputs from the wiring baseboard 410 to the plurality of I/O adapter boards 404 (e.g., as previously described in connection with FIG. 1). For example, the plurality of I/O adapter boards 404 can be electrically connected to the wiring baseboard 410 of a controller via the plurality of traces of the PCB base 406 such that an electric current can flow between the plurality of I/O adapter boards 404 and the wiring baseboard 410.

Replacing an existing number of I/O modules can include electrically connecting a number of new I/O modules 428 to two of the plurality of I/O adapter boards 404 where the number of new I/O modules 428 are adjacent to the two of the plurality of I/O adapter boards 404. For example, a number of new I/O modules 428 can be electrically connected to two of the plurality of I/O adapter boards 404 by a number of receiving terminals (e.g., number of receiving terminals 120, 220, previously described in connection with FIGS. 1 and 2, respectively) of two of the plurality of I/O adapter boards 404 receiving a number of connection pins of the number of new I/O modules 428 (e.g., as previously described in connection with FIG. 2).

Electrically connecting the number of new I/O modules 428 to two of the plurality of I/O adapter boards 404 can allow for the number of new I/O modules 428 to be electrically connected to the wiring baseboard 410 via the two of the plurality of I/O adapter boards 404 and the PCB base 406. For example, the number of new I/O modules 428 can be electrically connected to the wiring baseboard 410 such that an electric current can flow between the number of new I/O modules 428 and the wiring baseboard 410.

The number of new I/O modules 428 can include a lower quantity of I/O modules than the plurality of I/O adapter boards 404. In some examples, as shown in FIG. 4, the number of new I/O modules 428 include two new I/O modules, where the plurality of I/O adapter boards include four I/O adapter boards. In some examples, although not shown in FIG. 4, the number of new I/O modules 428 can include one or three new I/O modules.

Although the number of new I/O modules 428 is described as including two new I/O modules 428, embodiments of the present disclosure are not so limited. For example, the number of new I/O modules 428 can include the same quantity of I/O modules and I/O adapter boards. For instance, the number of new I/O modules 428 can include four new I/O modules that can be connected with four I/O adapter boards.

The top housing 402 can include a plurality of covers 434 to cover a number of the I/O adapter boards 404 not connected to a new I/O module 428. For example, as shown in FIG. 4, two of the plurality of I/O adapter boards 404 are not connected to a new I/O module 428. Two covers 434 can cover the two of the plurality of I/O adapter boards 404 that are not connected to a new I/O module 428. The plurality of covers 434 can help guard against dust, moisture, and/or other contaminants from coming into contact with the plurality of I/O adapter boards 404.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A hardware migration device that is configured to be used when replacing an existing building controller with a new building controller without having to rewire a plurality of wiring connections, the existing building controller operably coupled to a wiring baseboard, the hardware migration device comprising:
a top housing;
a plurality of input/output (I/O) adapter boards that are housed by the top housing and are configured to connect to a number of I/O modules of the new building controller when replacing the existing building controller with the new building controller;
a base housing adjacent to the top housing; and
a printed circuit board (PCB) base adjacent to the plurality of I/O adapter boards and housed by the base housing, wherein:
the plurality of I/O adapter boards are electrically connected to the PCB base via a plurality of connectors that each include a first part with a number of connection pins and a second part that includes a number of receiving terminals, wherein the number of receiving terminals are configured to receive the number of connection pins to form an electrical connection; and
the PCB base includes a plurality of traces configured to provide an electrical path from the plurality of connectors that are coupled to the plurality of I/O adapter boards to the wiring baseboard to which the existing building controller was connected when the hardware migration device is connected to the wiring baseboard.

2. The hardware migration device of claim 1, wherein the PCB base includes a number of connection pins connected to the plurality of traces and configured to connect to receiving terminals on the wiring baseboard to provide an electrical connection between the wiring baseboard and the PCB base.

3. The hardware migration device of claim 1, wherein:
the PCB base includes a number of receiving terminals connected to the plurality of traces; and
each of the plurality of I/O adapter boards include a number of connection pins.

4. The hardware migration device of claim 3, wherein the number of receiving terminals of the PCB base are configured to receive the number of connection pins of each of the plurality of I/O adapter boards to provide an electrical connection between the PCB base and the plurality of I/O adapter boards.

5. The hardware migration device of claim 1, wherein each of the plurality of I/O adapter boards include a number of receiving terminals to connect to the number of I/O modules of the new building controller to provide an electrical connection between the plurality of I/O adapter boards and the number of I/O modules.

6. The hardware migration device of claim 1, wherein each of the plurality of I/O adapter boards include a number of receiving terminals to connect to the new building controller to provide an electrical connection between the plurality of I/O adapter boards and the new controller.

7. The hardware migration device of claim 1, wherein the top housing includes a plurality of slots configured to house the plurality of I/O adapter boards.

8. A hardware migration system for replacing an existing building controller with a new building controller without having to rewire a plurality of wiring connections, the hardware migration system comprising:
a new building controller and a number of new I/O modules, wherein the new building controller and the number of new I/O modules are configured to connect to a wiring baseboard; and
a hardware migration device, including:
a plurality of input/output (I/O) adapter boards housed by a top housing;
a printed circuit board (PCB) base adjacent to the plurality of I/O adapter boards and housed by a base housing that is adjacent to the top housing,
wherein:
the plurality of I/O adapter boards are electrically connected to the PCB base via a plurality of connectors that each include a first part with a number of connection pins and a second part that includes a number of receiving terminals, wherein the number of receiving terminals are configured to receive the number of connection pins to form an electrical connection;
the PCB base includes a plurality of traces configured to provide an electrical path for inputs from the wiring baseboard to the plurality of connectors that are then coupled to the plurality of I/O adapter boards;
the number of new I/O modules are electrically connected to the plurality of I/O adapter boards to configure the new building controller for use with the wiring baseboard to which the existing controller was previously connected; and the wiring baseboard is adjacent to and configured to be electrically connected to the PCB base.

9. The system of claim 8, wherein the number of new I/O modules are electrically connected to the wiring baseboard via the plurality of I/O adapter boards, the plurality of connectors, and the PCB base.

10. The system of claim 8, wherein the number of new I/O modules are adjacent to the plurality of I/O adapter boards.

11. The system of claim 8, wherein the number of new I/O modules and the plurality of I/O adapter boards include a same quantity of new I/O modules and I/O adapter boards.

12. The system of claim 8, wherein the number of new I/O modules include a lower quantity of new I/O modules than the plurality of I/O adapter boards.

13. The system of claim 8, wherein the top housing includes a plurality of covers configured to cover a number of the I/O adapter boards not connected to a new I/O module.

* * * * *